United States Patent
Li et al.

(10) Patent No.: US 10,453,369 B2
(45) Date of Patent: Oct. 22, 2019

(54) SHIFT REGISTER UNIT, DRIVING METHOD THEREOF, GATE DRIVER ON ARRAY AND DISPLAY APPARATUS

(71) Applicants: BOE Technology Group Co., Ltd., Beijing (CN); Beijing BOE Optoelectronics Technology Co., Ltd., Beijing (CN)

(72) Inventors: Yan Li, Beijing (CN); Lingyun Shi, Beijing (CN); Wei Sun, Beijing (CN); Xiaobo Xie, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/879,724

(22) PCT Filed: Aug. 21, 2017

(86) PCT No.: PCT/CN2017/098304
§ 371 (c)(1),
(2) Date: Jan. 25, 2018

(87) PCT Pub. No.: WO2018/059159
PCT Pub. Date: Apr. 5, 2018

(65) Prior Publication Data
US 2019/0221149 A1  Jul. 18, 2019

(30) Foreign Application Priority Data
Sep. 30, 2016  (CN) .......................... 2016 1 0873900

(51) Int. Cl.
*G09G 3/20* (2006.01)
*G11C 19/28* (2006.01)

(52) U.S. Cl.
CPC ............. *G09G 3/20* (2013.01); *G11C 19/287* (2013.01); *G09G 2300/0408* (2013.01);
(Continued)

(58) Field of Classification Search
CPC ....... G09G 2310/0286; G09G 2330/06; G09G 3/3677; G11C 19/184; G11C 19/28
See application file for complete search history.

(56) References Cited

U.S. PATENT DOCUMENTS

| 8,723,844 B2 * | 5/2014 | Ko ........................ G09G 3/3677 345/204 |
| 8,803,562 B2 * | 8/2014 | Chung ................. G09G 3/3266 327/108 |

(Continued)

FOREIGN PATENT DOCUMENTS

| CN | 103035218 A | 4/2013 |
| CN | 104269145 | * 9/2014 |

(Continued)

OTHER PUBLICATIONS

Written Opinion for PCT application No. PCT/CN2017/098304 dated Nov. 23, 2017.

*Primary Examiner* — Kenneth Bukowski
(74) *Attorney, Agent, or Firm* — Fay Sharpe LLP

(57) ABSTRACT

The present disclosure relates to a shift register unit, a driving method thereof, a gate driver on array and a display apparatus. The shift register unit includes a clock control circuit (10), an output control circuit (20) and an output circuit (30). The shift register unit may input clock signals of different frequencies or different duty ratios to the output control circuit (20) and the output circuit (30) respectively via the clock control circuit (10), such that the output circuit (30) can input driving signals of different frequencies or different duty ratios to the pixel units via the output end (OUT) in order to adjust the charging time for each line of (Continued)

pixel units. As a result, the driving manner of the display apparatus by the gate driver on array is enriched, and the driving flexibility is improved.

20 Claims, 6 Drawing Sheets

(52) U.S. Cl.
CPC ............... *G09G 2300/0426* (2013.01); *G09G 2310/0286* (2013.01); *G09G 2310/08* (2013.01)

(56) References Cited

U.S. PATENT DOCUMENTS

| | | | |
|---|---|---|---|
| 2008/0258998 A1* | 10/2008 | Miyake | G11C 19/00 345/42 |
| 2011/0148853 A1 | 6/2011 | Ko | |
| 2011/0150169 A1* | 6/2011 | Lin | G11C 19/28 377/64 |
| 2011/0273417 A1* | 11/2011 | Shin | G09G 3/20 345/211 |
| 2013/0002306 A1 | 1/2013 | Chung | |
| 2014/0086379 A1* | 3/2014 | Ma | G11C 19/28 377/64 |
| 2014/0159999 A1* | 6/2014 | Gu | G11C 19/28 345/100 |
| 2014/0168181 A1* | 6/2014 | Furuta | G11C 19/28 345/205 |
| 2015/0206488 A1* | 7/2015 | Zhang | G09G 3/3677 345/92 |
| 2016/0300623 A1* | 10/2016 | Yang | G11C 19/28 |
| 2016/0372063 A1* | 12/2016 | Li | G11C 19/28 |
| 2017/0309211 A1* | 10/2017 | Zhang | G09G 3/20 |
| 2019/0005866 A1* | 1/2019 | Li | G09G 3/20 |
| 2019/0130806 A1* | 5/2019 | Li | G09G 3/3674 |

FOREIGN PATENT DOCUMENTS

| | | |
|---|---|---|
| CN | 104835466 A | 8/2015 |
| CN | 106251804 A | 12/2016 |
| EP | 2357643 A1 | 8/2011 |
| KR | 20110069970 A | 6/2011 |
| KR | 20130003250 A | 1/2013 |

* cited by examiner

US 10,453,369 B2

SHIFT REGISTER UNIT, DRIVING METHOD THEREOF, GATE DRIVER ON ARRAY AND DISPLAY APPARATUS

TECHNICAL FIELD

The present disclosure is related to a shift register unit, a driving method thereof, a gate driver on array and a display apparatus.

BACKGROUND

When displaying an image, a display apparatus needs a gate driver on array (GOA) to drive the pixel units. The gate driver on array (also called shift register) includes multiple cascading shift register units, each of which is used to drive a line of pixel units. The multiple cascading shift register units realize line-by-line scan-driving of the multiple lines of pixel units of the display apparatus to display the image.

In the related art, a gate driver on array can scan all lines of pixel units in a display apparatus within the time of one frame. The charging time for each line of pixel units is determined by the frequency of a clock signal.

As the frequency and the duty ratio of the clock signal output from the clock signal terminal coupled to the shift register unit are fixed, when the gate driver on array drives the pixel units, the charging time for each line of pixel units is also fixed, and the driving manner is monotonous.

SUMMARY

In a first aspect, embodiments of the present disclosure provide a shift register unit, including: a clock control circuit, an output control circuit and an output circuit. The clock control circuit is coupled to a control signal terminal, a first clock signal terminal, a second clock signal and terminal, a third clock signal terminal, the output control circuit and the output circuit respectively, and the clock control circuit is configured to, under the control of a control signal from the control signal terminal and a third clock signal from the third clock signal terminal, input a first clock signal from the first clock signal terminal and a second clock signal from the second clock signal terminal to the output circuit alternately, and input an inverted signal of the first clock signal and an inverted signal of the second clock signal to the output control circuit alternately, wherein the first, second and third clock signals have the same frequency but different phases. The output control circuit is coupled to the clock control circuit, a pull-up node and an output terminal respectively, and is configured to control the electric potentials of the pull-up node and the output terminal. The output circuit is connected to the clock control circuit, the pull-up node and the output terminal respectively, and is configured to input a signal from the clock control circuit to the output terminal under the control of the pull-up node.

In a second aspect, embodiments of the present disclosure provide a method for driving a shift register unit. The shift register unit includes a clock control circuit, an output control circuit and an output circuit. The method includes: in a first driving mode in which a control signal output by a control signal terminal has a first electric potential, the clock control circuit inputs a first clock signal from a first clock signal terminal to the output circuit and inputs an inverted signal of the first clock signal to the output control circuit; and in a second driving mode in which the control signal output by the control signal terminal has a second electric potential, a third clock signal terminal outputs a third clock signal, the clock control circuit alternately inputs the first clock signal and a second clock signal from a second clock signal terminal to the output circuit and alternately inputs the inverted signal of the first clock signal and an inverted signal of the second clock signal to the output control circuit; where the first, second and third clock signals have the same frequency but different phases.

In a third aspect, embodiments of the present disclosure provide a gate driver on array, including: at least two cascaded shift register units. Each of the shift register units is a shift register unit described in the first aspect.

In a fourth aspect, embodiments of the present disclosure provide a display apparatus, including the gate driver on array described in the third aspect.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION OF THE EMBODIMENTS

Figure 1:
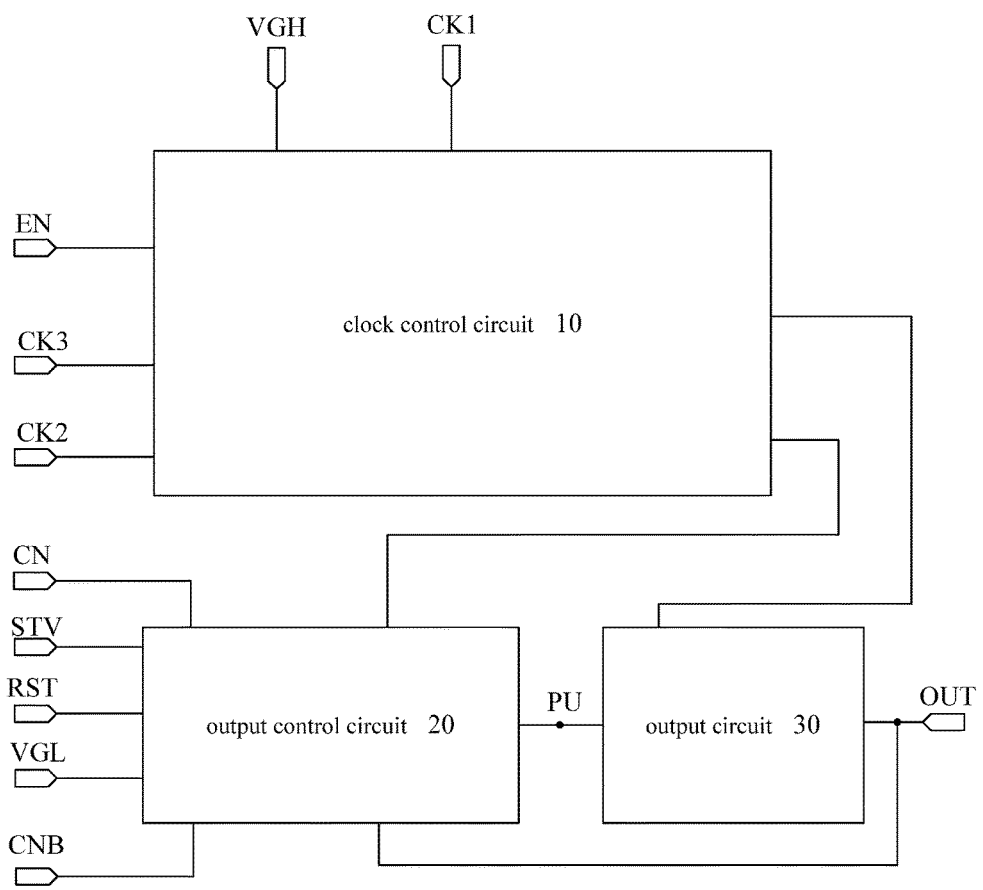
FIG. 1 is a structural schematic view of a shift register unit provided in an embodiment of the present disclosure.

To make the objectives, technical solutions and advantages of the present disclosure clearer, the embodiments of the present disclosure will be described in detail with reference to the accompanying drawings. Apparently, the described embodiments are only a part but not all of the embodiments of the present disclosure. All other embodiments obtained by a person skilled in the art based on the embodiments of the present disclosure without creative efforts shall fall within the protection scope of the present disclosure.

The transistors used in all the embodiments of the present disclosure may be thin film transistors or field effect transistors or other components having the same properties. The transistors used in the embodiments of the present disclosure are mainly switch transistors in accordance with the role of the transistors in a circuit. As the source electrode and the drain electrode of the switch transistor used herein are symmetrical, they may be interchangeable. In the embodiments of the present disclosure, the source electrode is called the first electrode, the drain electrode is called the second electrode, and the gate electrode is called the third electrode. It is specified that the middle terminal of the transistor is the gate electrode, the signal input terminal is the source electrode, and the output terminal is the drain electrode based on the configuration in the drawings. In addition, the switch transistors used in the embodiments of the present disclosure may include P-type switch transistors and N-type switch transistors. The P-type switch transistor is turned on when the gate electrode is at a low electric potential, and is turned off when the gate electrode is at a high electric potential. The N-type switch transistor is turned on when the gate electrode is at a high electric potential, and is turned off when the gate electrode is at a low electric potential. Further, each of the signals in the embodiments of the present disclosure corresponds to a first electric potential and a second electric potential. The first and second electric potentials only indicate that the electric potentials of the signal have two states, and do not indicate that the first or second electric potential in the present disclosure has a specific value. In other words, the values of the first (or second) electric potentials of the signals may be the same or different. Further, the first, second and third clock signals in the embodiments of the present disclosure have the same frequency, but they have different phases from each other. For example, the duty ratio of the first, second and third clock signals may be ½, the phase difference between the first and second clock signals is 180 degrees, and the phase difference between the first and third clock signals is 90 degrees.

The embodiments of the present disclosure provide a shift register unit, a driving method thereof, a gate driver on array and a display apparatus. The shift register unit includes an output control circuit, an output circuit and a clock control circuit. Using the clock control circuit, clock signals of different frequencies or different duty ratios may be input to the output control circuit and the output circuit respectively, such that the output circuit can input driving signals of different frequencies or different duty ratios to the pixel units via the output end so as to adjust the charging time for each line of pixel units. As a result, the driving manner of the display apparatus by the gate driver on array is enriched, and the driving flexibility is improved.

FIG. 1 is a schematic structural view of a shift register unit provided by an embodiment of the present disclosure. As shown in FIG. 1, the shift register unit may include a clock control circuit 10, an output control circuit 20 and an output circuit 30.

The clock control circuit 10 is coupled to a control signal terminal EN, a first power source signal terminal VGH, a first clock signal terminal CK1, a second clock signal terminal CK2, a third clock signal terminal CK3, the output control circuit 20 and the output circuit 30 respectively, and is configured to, under the control of a control signal from the control signal terminal EN and a third clock signal from the third clock signal terminal CK3, input a first clock signal from the first clock signal terminal CK1 to the output circuit 30, and input an inverted signal of the first clock signal to the output control circuit 20, or input the first clock signal and a second clock signal from the second clock signal terminal CK2 to the output circuit 30 alternately, and input the inverted signal of the first clock signal and an inverted signal of the second clock signal to the output control circuit 20 alternately. The first, second and third clock signals have the same frequency, but they have different phases from each other.

The output control circuit 20 is coupled to the clock control circuit 10, an input signal terminal STV, a reset signal terminal RST, a second power source signal terminal VGL, a third power source signal terminal CN, a fourth power source signal terminal CNB, a pull-up node PU and an output terminal OUT respectively, and is configured to control the electric potentials of the pull-up node PU and the output terminal OUT. The output circuit 30 is coupled to the clock control circuit 10, the pull-up node PU and the output terminal OUT respectively, and is configured to input a signal from the clock control circuit 10 to the output terminal OUT under the control of the pull-up node PU.

To sum up, the embodiment of the present disclosure provides a shift register unit. The shift register unit includes an output control circuit, an output circuit and a clock control circuit. Using the clock control circuit, a first clock signal can be input to the output circuit, or a first clock signal and a second clock signal can be input alternately to the output circuit, such that the output circuit can input driving signals of different frequencies or different duty ratios to the pixel units under the control of the signals input by the clock control circuit so as to adjust the charging time for each line of pixel units. As a result, the driving manner of the display apparatus by the gate driver on array is enriched, and the driving flexibility is improved.

Figure 2:
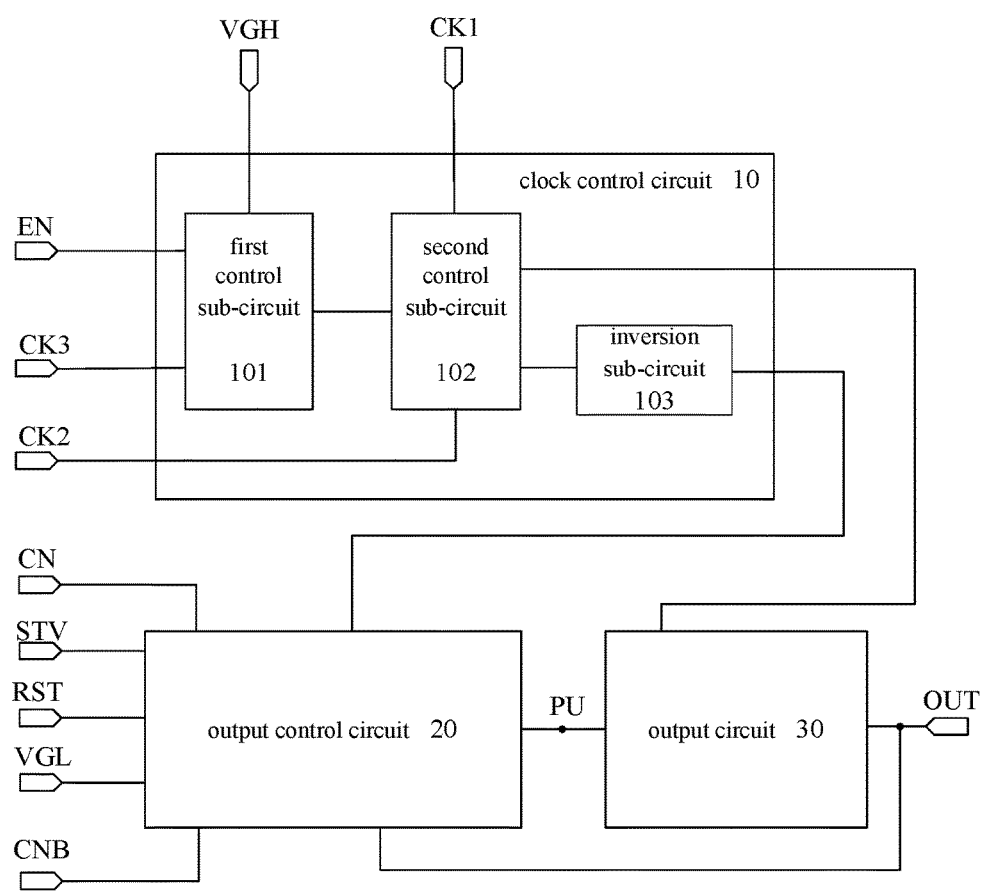
FIG. 2 is another structural schematic view of a shift register unit provided in an embodiment of the present disclosure.

FIG. 2 is another schematic structural view of a shift register unit provided by another embodiment of the present disclosure. As shown in FIG. 2, the clock control circuit 10 may include a first control sub-circuit 101, a second control sub-circuit 102 and an inversion sub-circuit 103.

The first control sub-circuit 101 is coupled to the control signal terminal EN, the first power source signal terminal VGH, the third clock signal terminal CK3 and the second control sub-circuit 102 respectively, and is configured to, under the control of the control signal, input a first power source signal from the first power source signal terminal VGH or a third clock signal from the third clock signal terminal CK3 to the second control sub-circuit 102.

The second control sub-circuit 102 is coupled to the first control sub-circuit 101, the first clock signal terminal CK1, the second clock signal terminal CK2, the inversion sub-circuit 103 and the output circuit 30 respectively, and is configured to, under the control of the first power source signal, input the first clock signal to the inversion sub-circuit 103 and the output circuit 30 respectively, or under the control of the third clock signal, alternately input the first and second clock signals to the inversion sub-circuit 103 and the output circuit 30 respectively.

The inversion sub-circuit 103 is coupled to the second control sub-circuit 102 and the output control circuit 20 respectively, and is configured to invert the signal input by the second control sub-circuit 102 and input the inverted signal to the output control circuit 20.

Figure 3:
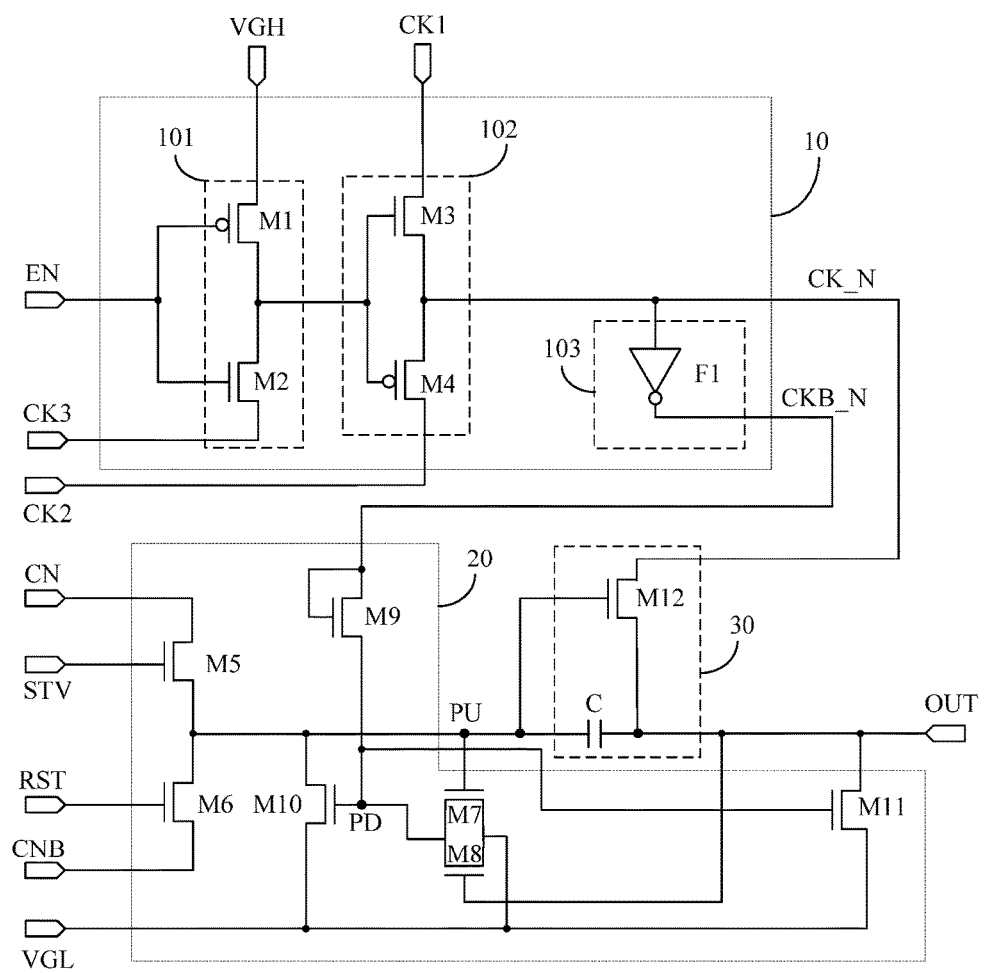
FIG. 3 is a structural schematic view of a circuit of a shift register unit provided in an embodiment of the present disclosure.

FIG. 3 is a schematic structural view of the circuit of a shift register unit provided by an embodiment of the present disclosure. As shown in FIG. 3, the first control sub-circuit 101 may include a first transistor M1 and a second transistor M2. The first transistor M1 and the second transistor M2 have opposite polarities. For example, as shown in FIG. 3, the first transistor M1 may be a P-type transistor, and the second transistor M2 may be an N-type transistor. Alternatively, the first transistor M1 may be an N-type transistor, and the second transistor M2 may be a P-type transistor.

The gate electrode of the first transistor M1 is coupled to the control signal terminal EN, the first electrode thereof is coupled to the first power source signal terminal VGH, and the second electrode thereof is coupled to the second control sub-circuit 102.

The gate electrode of the second transistor M2 is coupled to the control signal terminal EN, the first electrode thereof is coupled to the third clock signal terminal CK3, and the second electrode thereof is coupled to the second control sub-circuit 102.

Referring to FIG. 3, the inversion sub-circuit 103 includes a first inverter F1. The input terminal of the first inverter F1 is coupled to the second control sub-circuit 102 and signal output terminal thereof is coupled to the output control circuit 20.

In an embodiment of the present disclosure, as shown in FIG. 3, the second control sub-circuit 102 may include a third transistor M3 and a fourth transistor M4. The third transistor M3 and the fourth transistor M4 have opposite polarities. For example, as shown in FIG. 3, the third transistor M3 may be an N-type transistor, and the fourth transistor M4 may be a P-type transistor. Alternatively, the third transistor M3 may be a P-type transistor, and the fourth transistor M4 may be an N-type transistor.

The gate electrode of the third transistor M3 is coupled to the first control sub-circuit 101. As shown in FIG. 3, the gate electrode of the third transistor M3 is respectively coupled to the second electrode of the first transistor M1 and the second electrode of the second transistor M2, the first electrode thereof is coupled to the first clock signal terminal CK1, and the second electrode thereof is coupled to the inversion sub-circuit 103 and the output circuit 30 respectively.

The gate electrode of the fourth transistor M4 is coupled to the first control sub-circuit 101. As shown in FIG. 3, the gate electrode of the fourth transistor M4 is respectively coupled to the second electrode of the first transistor M1 and the second electrode of the second transistor M2, the first electrode thereof is coupled to the second clock signal terminal CK2, and the second electrode thereof is coupled the inversion sub-circuit 103 and the output circuit 30 respectively.

Figure 4:
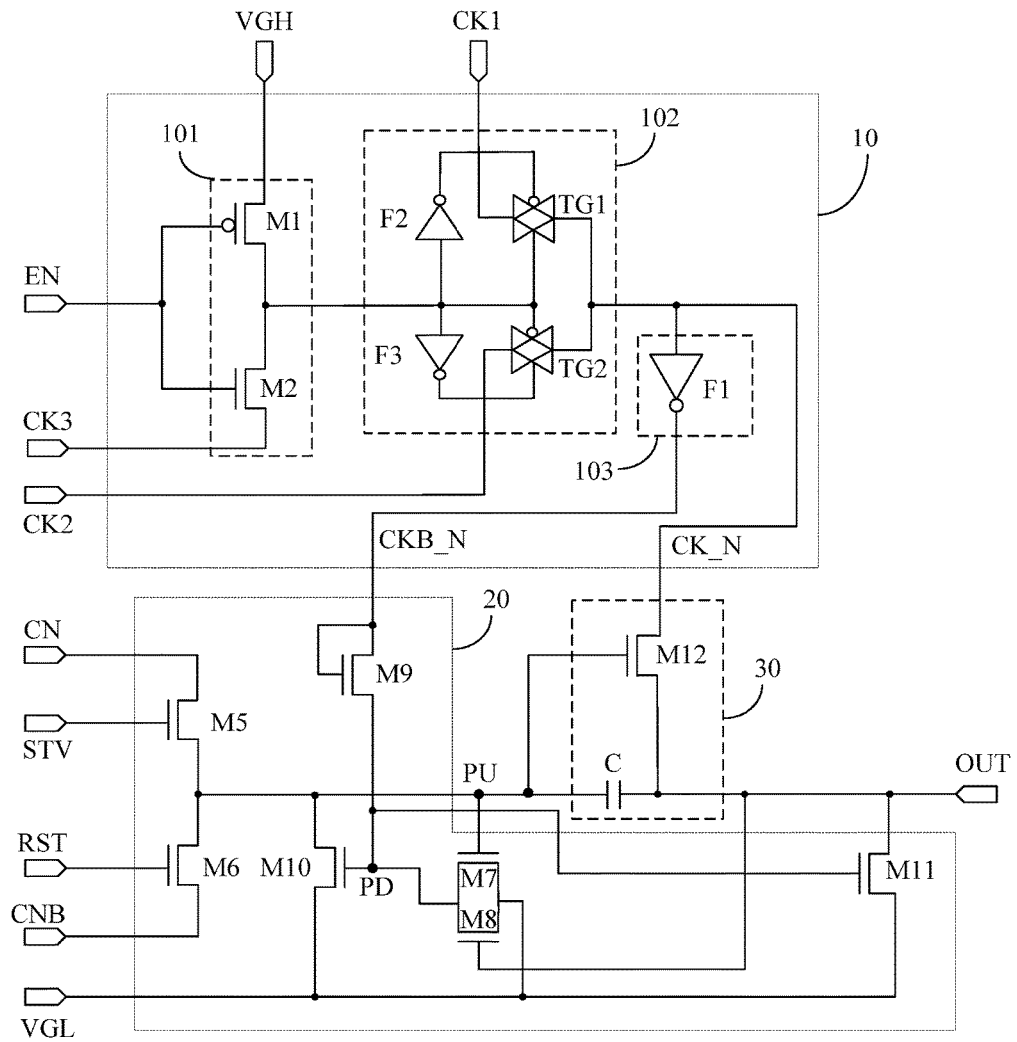
FIG. 4 is another structural schematic view of a circuit of a shift register unit provided in an embodiment of the present disclosure.

In another embodiment of the present disclosure, as shown in FIG. 4, the second control sub-circuit 102 may further include a second inverter F2, a first transmission gate TG1, a third inverter F3 and a second transmission gate TG2.

The input terminal of the second inverter F2 is coupled to the first control sub-circuit 101. For example, the input terminal of the second inverter F2 is coupled to the output terminal of the first control sub-circuit 101. The signal output terminal of the second inverter F2 is coupled to the first control terminal of the first transmission gate TG1. The second control terminal of the first transmission gate TG1 is coupled to the first control sub-circuit 101, the input terminal thereof is coupled to the first clock signal terminal CK1, and the signal output terminal thereof is coupled to the inversion sub-circuit 103 and the output circuit 30 respectively.

The input terminal of the third inverter F3 is coupled to the first control sub-circuit 101. For example, the input terminal of the third inverter F3 is coupled to the output terminal of the first control sub-circuit 101. The signal output terminal of the third inverter F3 is coupled to the second control terminal of the second transmission gate TG2. The first control terminal of the second transmission gate TG2 is coupled to the first control sub-circuit 101, the input terminal thereof coupled to the second clock signal terminal CK2, and the signal output terminal thereof is coupled to the inversion sub-circuit 103 and the output circuit 30 respectively.

In an implementation manner of the embodiment of the present disclosure, the first, second and third clock signals may have the same duty ratio of ½, the phase difference between the first and second clock signals may be 180 degrees, and the phase difference between the first and third clock signals may be 90 degrees.

In an implementation manner of the embodiment, as shown in FIGS. 3 and 4, the output control circuit 20 of the shift register unit may include a first output control transistor M5, a second output control transistor M6, a third output control transistor M7, a fourth output control transistor M8, a fifth output control transistor M9, a sixth output control transistor M10 and a seventh output control transistor M11. The output circuit 30 may include an output transistor M12 and a capacitor C.

For example, the gate electrode of the first output control transistor M5 is coupled to the input signal terminal STV, the first electrode thereof is coupled to the third power source signal terminal CN, and the second electrode thereof is coupled to the pull-up node PU.

The gate electrode of the second output control transistor M6 is coupled to the reset signal terminal RST, the first electrode thereof is coupled to the fourth power source signal terminal CNB, and the second electrode thereof is coupled to the pull-up node PU.

The gate electrode of the third output control transistor M7 is coupled to the pull-up node PU, the first electrode thereof is coupled to the second power source signal terminal VGL, and the second electrode thereof is coupled to a pull-down node PD.

The gate electrode of the fourth output control transistor M8 is coupled to the output terminal OUT, the first electrode thereof is coupled to the second power source signal terminal VGL, and the second electrode thereof is coupled to the pull-down node PD.

The gate electrode and the first electrode of the fifth output control transistor M9 is coupled to the clock control circuit 10 (such as the first output terminal CKB_N of the clock control circuit 10), and the second electrode thereof is coupled to the pull-down node PD.

The gate electrode of the sixth output control transistor M10 is coupled to pull-down node PD, the first electrode thereof is coupled to the second power source signal terminal VGL, and the second electrode thereof is coupled to the pull-up node PD.

The gate electrode of the seventh output control transistor M11 is coupled to the pull-down node PD, the first electrode thereof is coupled to the second power source signal terminal VGL, and the second electrode thereof is coupled to the output terminal OUT.

The gate electrode of the output transistor M12 is coupled to the pull-up node PU, the first electrode thereof to the clock control circuit 10 (such as the second output terminal CK_N of the clock control circuit 10), and the second electrode thereof is coupled to the output terminal OUT. One terminal of the capacitor C is coupled to the pull-up node PU, and the other terminal thereof is coupled to the output terminal OUT.

To sum up, the embodiment of the present disclosure provides a shift register unit. The shift register unit includes an output control circuit, an output circuit and a clock control circuit. Using the clock control circuit, a first clock signal can be input to the output circuit, or a first clock signal and a second clock signal can be input alternately to the output circuit, such that the output circuit can input driving signals of different frequencies or different duty ratios to the pixel units under the control of the signals input by the clock control circuit so as to adjust the charging time for each line of pixel units by the shift register unit. When the driving signal input by the output circuit has a relatively higher frequency, the charging time for each line of pixel units is relatively shorter, and the display resolution of the display apparatus is relatively higher, thereby realizing high definition display of the display apparatus. When the driving signal input by the output circuit has a relatively lower frequency, the charging time for each line of pixel units is relatively longer, and the display resolution of the display apparatus is relatively lower, thereby realizing display of the display apparatus with low power consumption. As a result, the driving manner of the display apparatus by the gate driver on array is enriched, and the driving flexibility is improved.

It should be noted that each embodiment of the present disclosure is illustrated by taking an example in which the first transistor M1 and the fourth transistor M4 are P-type transistors while the other transistors (M2, M3 and M5-M12) are N-type transistors, and the second electric potential is a high electric potential relative to the first electric potential.

Of course, the first transistor M1 and the fourth transistor M4 may also be N-type transistors, while the other transistors (M2, M3 and M5-M12) may also be P-type transistors. In this case, the second electric potential may be a low electric potential relative to the first electric potential, and the electric potential changes at each signal terminal may be opposite to those shown in FIG. 6 described below (that is, the phase difference between the two is 180 degrees).

Figure 5:
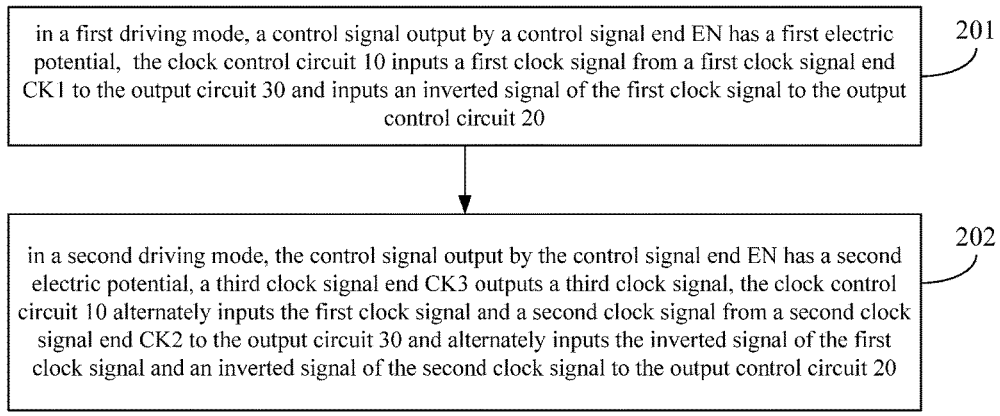
FIG. 5 is a flow chart of a method for driving a shift register unit provided in an embodiment of the present disclosure.

FIG. 5 is a flow chart of a driving method of a shift register unit provided by an embodiment of the present disclosure. The method can be applied to drive any of the shift register units shown in FIGS. 1-4. As shown in FIG. 1, the shift register unit may include a clock control circuit 10, an output control circuit 20 and an output circuit 30. Referring to FIG. 5, the method may include the following steps.

In step 201, in the first driving mode, a control signal output by a control signal terminal EN has the first electric potential, the clock control circuit 10 inputs a first clock signal from a first clock signal terminal CK1 to the output circuit 30 and inputs an inverted signal of the first clock signal to the output control circuit 20.

In step 202, in the second driving mode, the control signal output by the control signal terminal EN has the second electric potential, a third clock signal terminal CK3 outputs a third clock signal, the clock control circuit 10 alternately inputs the first clock signal and a second clock signal from a second clock signal terminal CK2 to the output circuit 30 and alternately inputs the inverted signal of the first clock signal and the inverted signal of the second clock signal to the output control circuit 20.

For example, the first, second and third clock signals have the same frequency, but they have different phases from each other. In addition, the second electric potential may be a high electric potential relative to the first electric potential.

To sum up, the embodiment of the present disclosure provides a driving method of a shift register unit by the embodiment of the present disclosure. The driving method includes two driving modes (for example, the first driving mode and the second driving mode described above). In different driving modes, frequencies of the signals input by the clock control circuit to the output circuit are different, such that the output circuit can input driving signals of different frequencies or different duty ratios to the pixel units so as to adjust the charging time for each line of pixel units by the shift register unit. Therefore, the driving manner of the display apparatus by the gate driver on array is enriched, and the driving flexibility is improved.

Figure 6:
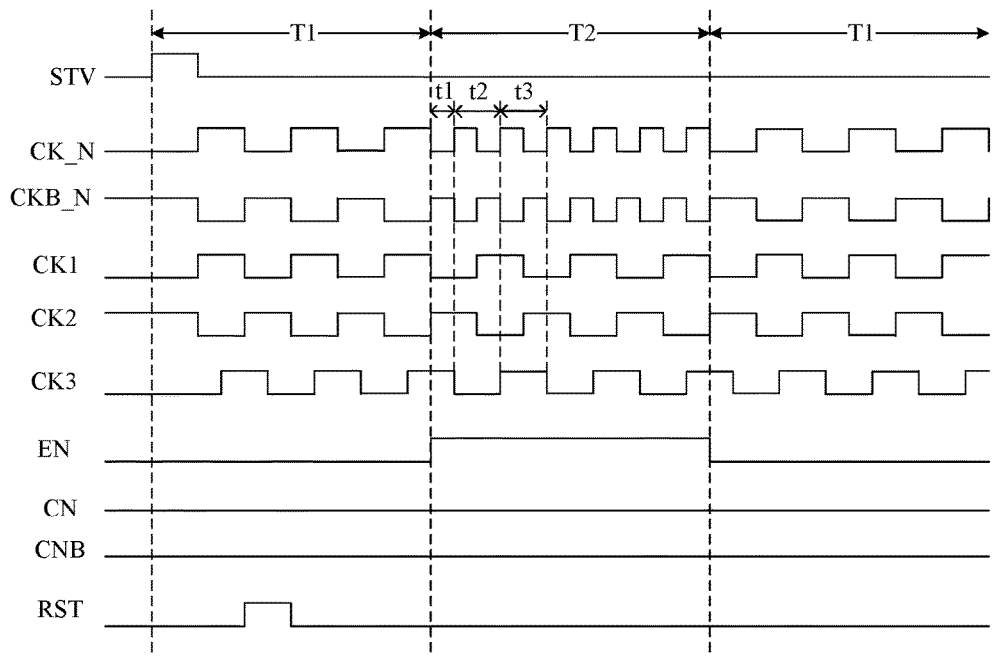
FIG. 6 is a time sequence diagram of signals in a shift register unit provided in an embodiment of the present disclosure.

For example, as shown in FIG. 2, the clock control circuit 10 may include a first control sub-circuit 101, a second control sub-circuit 102 and an inversion sub-circuit 103. FIG. 6 is a time sequence diagram of a driving method provided by an embodiment of the present disclosure. In FIG. 6, the signal CK_N is a signal input by the second control sub-circuit 102 to the output circuit 30, and the signal CKB_N is a signal input by the inversion sub-circuit 103 to the output control circuit 20.

As shown in FIG. 6, in the first driving mode T1, a control signal output by the control signal terminal EN has the first electric potential, and the first control sub-circuit 101 inputs to the second control sub-circuit 102 a first power source signal from the first power source signal terminal VGH, where the first power source signal has the second electric potential, and the second electric potential may be a high electric potential relative to the first electric potential. The second control sub-circuit 102 inputs the first clock signal to the output circuit 30 and the inversion sub-circuit 103 respectively under the control of the first power source signal. The inversion sub-circuit 103 inputs the first clock signal to the output control circuit 20 after inverting the first clock signal. Exemplarily, it can be seen from FIG. 6 that in the first driving mode T1, the signal CK_N input by the second control sub-circuit 102 to the output circuit 30 is the first clock signal output by the first clock signal terminal CK1, and the signal CKB_N input by the inversion sub-circuit 103 to the output control circuit 20 and the signal CK_N have opposite phases.

In the second driving mode T2, a control signal output by the control signal terminal EN has the second electric potential, and the first control sub-circuit 101 inputs to the second control sub-circuit 102 a third clock signal from the third clock signal terminal CK3. When the third clock signal has the second electric potential, the second control sub-circuit 102 inputs the first clock signal to the output circuit 30 and the inversion sub-circuit 103, respectively. When the third clock signal has the first electric potential, the second control sub-circuit 102 inputs the second clock signal to the output circuit 30 and the inversion sub-circuit 103, respectively. The inversion sub-circuit 103 inputs the signal to the output control circuit 20 after inverting the signal input by the second control sub-circuit 102. Exemplarily, it can be seen from FIG. 6 that in the second driving mode T2, when the third clock signal output by the third clock signal terminal CK3 has the second electric potential, the signal CK_N input by the second control sub-circuit to the output circuit is the first clock signal; and when the third clock signal has the first electric potential, the signal CK_N input by the second control sub-circuit to the output circuit is the second clock signal, and the signal CKB_N input by the inversion sub-circuit to the output control circuit and the signal CK_N have opposite phases.

In an exemplary embodiment of the present disclosure, referring to FIG. 3, the first control sub-circuit 101 includes: a first transistor M1 and a second transistor M2 which have opposite polarities. The second control sub-circuit 102 includes a third transistor M3 and a fourth transistor M4 which have opposite polarities. Exemplarily, as shown in FIG. 3, the first transistor M1 and the fourth transistor M4 are P-type transistors, and the second transistor M2 and the third transistor M3 are N-type transistors.

In the first driving mode T1, the control signal has the first electric potential, the first transistor M1 is turned on, and the second transistor M2 is turned off. Here, the first power source signal terminal VGH inputs to the second control sub-circuit 102 the first power source signal from the first power source signal terminal VGH. As the first power source signal has the second electric potential, the third transistor M3 is turned on and the fourth transistor M4 is turned off. The first clock signal terminal CK1 inputs the first clock signal to the output circuit 30 and the inversion sub-circuit 103, respectively. The inversion sub-circuit 103 inputs the first clock signal to the output control circuit 20 after inverting the first clock signal. As shown in FIG. 6, in the first driving mode T1, the waveform of the signal CK_N output by the second control sub-circuit is the same as that of the first clock signal (namely, the signal output by the first clock signal terminal CK1), and the signal CKB_N output by the inversion sub-circuit and the first clock signal have opposite phases.

In the second driving mode T2, the control signal has the second electric potential, the first transistor M1 is turned off, the second transistor M2 is turned on, and the third clock signal terminal CK3 inputs to the second control sub-circuit 102 the third clock signal. When the third clock signal has the second electric potential, the third transistor M3 is turned on, the fourth transistor M4 is turned off, and the first clock signal terminal CK1 inputs the first clock signal to the output circuit 30 and the inversion sub-circuit 103, respectively. For example, in FIGS. 6, at t1 and t3 stages in the second driving mode T2, the third clock signal output by the third clock signal terminal CK3 has the second electric potential. Here, the waveform of the signal CK_N output by the second control sub-circuit is the same as that of the first clock signal. When the third clock signal has the first electric potential, the third transistor M3 is turned off, the fourth transistor M4 is turned on, and the second clock signal terminal CK2 inputs the second clock signal to the output circuit 30 and the inversion sub-circuit 103, respectively. For example, in FIG. 6, at t2 stage in the second driving mode T2, the third clock signal has the first electric potential, and the waveform of the signal CK_N output by the second control sub-circuit is the same as that of the second clock signal. Moreover, in the second driving mode T2, the signal CKB_N output by the inversion sub-circuit and the signal CK_N have opposite phases.

In another exemplary embodiment of the present disclosure, referring to FIG. 4, the first control sub-circuit 101 includes: a first transistor M1 and a second transistor M2 which have opposite polarities. The second control sub-circuit 102 includes: a second inverter F2, a first transmission gate TG1, a third inverter F3 and a second transmission gate TG2.

In the first driving mode T1, the control signal has the first electric potential, the first transistor M1 is turned on, and the second transistor M2 is turned off. Here, the first power source signal terminal VGH inputs to the second control sub-circuit 102 the first power source signal. As the first power source signal has the second electric potential, the second inverter F2 inputs the first power source signal to the first control terminal of the first transmission gate TG1 after inverting the first power source signal. Here, the first transmission gate TG1 is turned on. The third inverter F3 inputs the first power source signal to the second control terminal of the second transmission gate TG2 after inverting the first power source signal, and the second transmission gate TG2 is turned off. As the first transmission gate TG1 is turned on, the first clock signal terminal CK1 inputs the first clock signal to the output circuit 30 and the inversion sub-circuit 103, respectively, and the inversion sub-circuit 103 inputs the first clock signal to the output control circuit 20 after inverting the first clock signal. As shown in FIG. 6, in the first driving mode T1, the waveform of the signal CK_N output by the second control sub-circuit is the same as that of the first clock signal, and the signal CKB_N output by the inversion sub-circuit and the first clock signal have opposite phases.

In the second driving mode T2, the control signal has the second electric potential, the first transistor M1 is turned off, the second transistor M2 is turned on, and the third clock signal terminal CK3 inputs to the second control sub-circuit 102 the third clock signal. When the third clock signal has the second electric potential, the second inverter F2 inputs the third clock signal to the first control terminal of the first transmission gate TG1 after inverting the third clock signal and the third inverter F3 inputs the third clock signal to the second control terminal of the second transmission gate TG2 after inverting the third clock signal. The first transmission gate TG1 is turned on, and the second transmission gate TG2 is turned off. As the first transmission gate TG1 is turned on, the first clock signal terminal CK1 inputs the first clock signal to the output circuit 30 and the inversion sub-circuit 103, respectively. For example, in FIGS. 6, at t1 and t3 stages in the second driving mode T2, the waveform of the signal CK_N output by the second control sub-circuit is the same as that of the first clock signal. When the third clock signal has the first electric potential, the first transmission gate TG1 is turned off, the second transmission gate TG2 is turned on, and the second clock signal terminal CK2 inputs the second clock signal to the output circuit 30 and the inversion sub-circuit 103, respectively. For example, in FIG. 6, at t2 stage in the second driving mode T2, the waveform of the signal CK_N output by the second control sub-circuit is the same as that of the second clock signal. In the whole second driving mode T2, the signal CKB_N output by the inversion sub-circuit and the signal CK_N have opposite phases.

To sum up, in the embodiments of the present disclosure, the frequency of the signal CK_N input by the second control sub-circuit to the output circuit can be adjusted by adjusting the electric potential of the control signal output by the control signal terminal EN. Referring to FIG. 6, when the control signal has the first electric potential, the shift register unit is in the first driving mode T1. Under the first driving mode, the signal CK_N and the first clock signal have the same frequency. It can be seen from FIG. 6 that the frequency of the signal CK_N in the first driving mode is half of that in the second driving mode. In this case, the charging time for each line of pixel units by the shift register unit is relatively longer, the gate driver on array needs double time to scan all lines of pixel units in the display apparatus once compared with the time required in the second driving mode, and the display resolution of the display apparatus is relatively lower, so that display of the display apparatus with low power consumption can be achieved. When the control signal output by the control signal terminal EN has the second electric potential, the shift register unit is in the second driving mode T2, and the frequency of the signal CK_N is twice of that in the first driving mode T1. As a driving signal output when the shift register unit drives the pixel units is the signal CK_N, the charging time for each line of pixel units by the shift register unit is relatively shorter in the second driving mode T2, and the gate driver on array only needs half of time to scan all lines of pixel units in the display apparatus compared with the time required in the first driving mode. That is, the gate driver on array can scan all lines of pixel units in the display apparatus twice in the second driving mode within the time that it spends in scanning all lines of pixel units in the display apparatus once in the first driving mode, so that high definition display of the display apparatus can be achieved.

In an implementation manner of the embodiment of the present disclosure, referring to FIG. 6, the first, second and third clock signals may have the same duty ratio of ½ and the phase difference between the first and second clock signals is 180 degrees. That is, the first clock signal and the second clock signal have the same amplitude but opposite phases. The phase difference between the first and third clock signals is 90 degrees.

Figure 7:
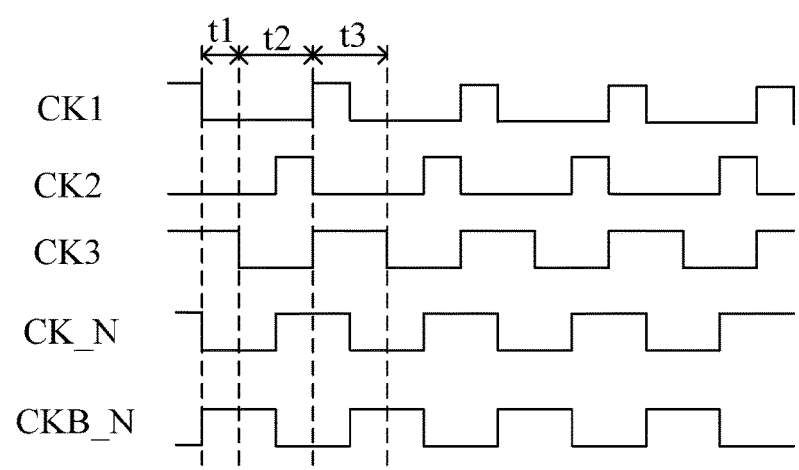
FIG. 7 is another time sequence diagram of signals in a shift register unit provided in an embodiment of the present disclosure.

It should be noted that the duty ratios of the first, second and third clock signals as well as the phase differences among the clock signals may also be adjusted based on actual conditions, which is not limited in this embodiment of the present disclosure. Exemplarily, the time sequence diagrams of the first, second and third clock signals, the signal CK_N and the signal CKB_N may further be as shown in FIG. 7 (only the time sequence of each signal in the second driving mode T2 is drawn in FIG. 7). For example, the duty ratio of the first clock signal output by the first clock signal terminal CK1 may be ¼; the duty ratio of the second clock signal output by the second clock signal terminal CK2 may also be ¼; and the duty ratio of the third clock signal output by the third clock signal terminal CK3 is ½. For the frequency and the duty ratio of each clock signal shown in FIG. 7, the frequency of the signal CK_N does not change under the first and second driving modes, but the duty ratio of the signal CK_N is ¼ in the first driving mode, and ½ in the second driving mode. Under the condition of the same frequency, the higher the duty ratio of the signal CK_N is, the longer the charging time for each line of pixel units is. Therefore, the charging time for each line of pixel units can be adjusted by changing the duty ratio of the driving signal of the shift register unit.

Further, the working principle of the shift register unit under any driving mode is described by taking the shift register unit shown in FIGS. 3 and 4 and the time sequence shown in FIG. 6 as an example. In any driving mode (for example, in the first driving mode or the second driving mode), the specific driving process of the shift register unit may include an input stage, an output stage and a reset stage.

During the input stage, the input signal output by the input signal terminal STV has the second electric potential, the first output control transistor M5 is turned on, and the third power source signal terminal CN inputs the third power source signal to the pull-up node PU. Referring to FIG. 6, the third power source signal has the second electric potential (e.g., the high electric potential), so that the electric potential of the pull-up node PU is pulled up. Here, the third output control transistor M7 and the output transistor M12 are turned on, the second power source signal terminal VGL inputs the second power source signal to the pull-down node PD, and the sixth output control transistor M10 is turned off. Here, the output circuit inputs the signal CK_N from the clock control circuit to the output terminal OUT, where the signal CK_N may have the first electric potential (e.g., the low electric potential) during the input stage.

During the output stage, the pull-up node maintains the second electric potential. When the signal CK_N input by the clock control circuit to the output circuit jumps to the second electric potential, the electric potential of the pull-up node PU is further pulled up due to the bootstrap effect. Here, the output transistor M12 is fully turned on, and the output circuit inputs the signal CK_N from the clock control circuit to the output terminal OUT, so as to turn on a line of pixel units (namely, driving the line of pixel units). As a result, a source driver on array in the display apparatus can charge this line of pixel units via a data line, and the charging time represents the time length when the signal CK_N has the second electric potential. As shown in FIG. 6, the time length when the signal CK_N has the second electric potential is relatively long in each cycle in the first driving mode T1 while the time length when the signal CK_N has the second electric potential is relatively short in each cycle in the second driving mode. Therefore, under different driving modes, the charging times for each line of pixel units by the shift register unit are different, thereby realizing high definition display or low power consumption display of the display apparatus.

During the reset stage, the reset signal output by the reset signal terminal RST has the second electric potential, so that the second output control transistor M6 is turned on, and the fourth power source signal terminal CNB inputs the fourth power source signal to the pull-up node PU. As the fourth power source signal has the first electric potential, the electric potential of the pull-up node PU is pulled down to the first electric potential. When the signal CK_N input by the clock control circuit to the output circuit jumps to the first electric potential again, and the signal CKB_N input by the clock control circuit to the output control circuit has the second electric potential, the fifth output control transistor M9 is turned on, the electric potential of the pull-down node PD is pulled up, the sixth output control transistor M10 and the seventh output control transistor M11 are turned on, and the second power source signal terminal VGL inputs the second power source signal to the pull-up node PU and the output terminal OUT, respectively, where the second power source signal has the first electric potential. Here, the shift register unit is turned off to prevent the abnormal output from the shift register unit from affecting other shift register units.

In addition, as both N-type transistors and P-type transistors are adopted in the shift register unit provided by the embodiments of the present disclosure, the shift register unit can be applied to a low temperature poly-silicon (LTPS) display apparatus. The LTPS display apparatus is excellent in signal transmission performance and signal stability, and has a filtering capacity.

To sum up, the embodiment of the present disclosure provides a driving method of a shift register unit. The driving method comprises two driving modes. Under different driving modes, the shift register unit can input driving signals of different frequencies or different duty ratios to the pixel units, such that the charging time for each line of pixel units by the shift register unit can be adjusted. For example, under the first driving mode, when the driving signal output from the shift register unit has a relatively lower frequency, the charging time for each line of pixel units is relatively longer, and the display resolution of the display apparatus is relatively lower, thereby realizing low power consumption display of the display apparatus. Under the second driving mode, when the driving signal output from the shift register unit has a relatively higher frequency, the charging time for each line of pixel units is relatively shorter, and the display resolution of the display apparatus is relatively higher, thereby realizing high definition display of the display apparatus. As a result, in the present embodiment, the driving manner of the display apparatus by the gate driver on array is enriched, and the driving flexibility is improved.

An embodiment of the present disclosure provides a gate driver on array which may include at least two cascaded shift register units shown in any of FIGS. 1-4.

An embodiment of the present disclosure provides a display apparatus which may include a gate driver on array. The gate driver on array may comprise at least two cascaded shift register units shown in any of FIGS. 1-4. The display apparatus may be a liquid crystal panel, an electronic paper, an OLED panel, an AMOLED panel, a cell phone, a tablet computer, a TV, a display, a tablet computer, a digital photo frame, a navigator or any other product or part having a display function.

The foregoing are exemplary embodiments of the present disclosure, and are not intended to limit the present disclosure. Within the spirit and principles of the disclosure, any modifications, equivalent substitutions, improvements, etc., are within the scope of protection of the present disclosure.

In the present disclosure, while the terms "first", "second" and so on may only be used to distinguish one entity or operation from another, it does not require or imply such an actual relation or sequence between these entities or operations. Further, the terms "include", "comprise" or any variation thereof are intended to cover an non-exclusive containing, such that a process, a method, an item or a device containing a series of elements not only includes these elements, but also includes other elements that are not set forth specifically, or also includes an inherent element of such a process, method, item or device. Without further limitation, an element defined by a phrase "include a" does not mean that other identical elements are excluded from the process, method, item or device.

The foregoing are only specific embodiments of the present disclosure, and are not intended to limit the present disclosure. Within the technical scope of the disclosure, any variations and substitutions that may be readily derived by those skilled in the art shall fall within the scope of protection of the present disclosure. Therefore, the scope of protection of the present disclosure shall be subject to the appended claims.

The present disclosure claims priority to Chinese Patent Application No.: 201610873900.6, filed with the State Intellectual Property Office on Sep. 30, 2016, the entire contents of which are incorporated herein by reference.

What is claimed is:

1. A shift register unit, comprising:
a clock control circuit, an output control circuit and an output circuit; wherein
the clock control circuit is coupled to a control signal terminal, a first clock signal terminal, a second clock signal terminal, a third clock signal terminal, the output control circuit and the output circuit respectively, and the clock control circuit is configured to, under the control of a control signal from the control signal terminal and a third clock signal from the third clock signal terminal, input a first clock signal from the first clock signal terminal and a second clock signal from the second clock signal terminal to the output circuit alternately, and input an inverted signal of the first clock signal and an inverted signal of the second clock signal to the output control circuit alternately, wherein the first, second and third clock signals have the same frequency but different phases;
the output control circuit is coupled to the clock control circuit, a pull-up node and an output terminal respectively, and is configured to control the electric potentials of the pull-up node and the output terminal; and the output circuit is coupled to the clock control circuit, the pull-up node and the output terminal respectively, and is configured to input a signal from the clock control circuit to the output terminal under the control of the pull-up node.

2. The shift register unit of claim 1, wherein the clock control circuit is further configured to, under the control of the control signal from the control signal terminal and the third clock signal from the third clock signal terminal, input the first clock signal to the output circuit, and input the inverted signal of the first clock signal to the output control circuit.

3. The shift register unit of claim 2, wherein the clock control circuit comprises a first control sub-circuit, a second control sub-circuit and an inversion sub-circuit;
the first control sub-circuit is coupled to the control signal terminal, a first power source signal terminal, the third clock signal terminal and the second control sub-circuit respectively, and is configured to, under the control of the control signal, input a first power source signal from the first power source signal terminal or the third clock signal from the third clock signal terminal to the second control sub-circuit;
the second control sub-circuit is coupled to the first control sub-circuit, the first clock signal terminal, the second clock signal terminal, the inversion sub-circuit and the output circuit respectively, and the second control sub-circuit is configured to, under the control of the first power source signal, input the first clock signal to the inversion sub-circuit and the output circuit respectively, or under the control of the third clock signal, alternately input the first and second clock signals to the inversion sub-circuit and alternately input the first and second clock signals to the output circuit; and
the inversion sub-circuit is coupled to the second control sub-circuit and the output control circuit respectively, and is configured to invert the signal input by the second control sub-circuit and input the inverted signal to the output control circuit.

4. The shift register unit of claim 2, wherein the output control circuit comprises a first output control transistor, a second output control transistor, a third output control transistor, a fourth output control transistor, a fifth output control transistor, a sixth output control transistor and a seventh output control transistor;
a gate electrode of the first output control transistor is coupled to an input signal terminal, a first electrode thereof is coupled to a third power source signal terminal, and a second electrode thereof is coupled to the pull-up node;
a gate electrode of the second output control transistor is coupled to a reset signal a first electrode thereof is coupled to a fourth power source signal terminal, and a second electrode thereof is coupled to the pull-up node;
a gate electrode of the third output control transistor is coupled to the pull-up node, a first electrode thereof is coupled to a second power source signal terminal, and a second electrode thereof is coupled to a pull-down node;
a gate electrode of the fourth output control transistor is coupled to the output terminal, a first electrode thereof is coupled to the second power source signal terminal, and a second electrode thereof is coupled to the pull-down node;

a gate electrode and the first electrode of the fifth output control transistor are coupled to the clock control circuit, and a second electrode thereof is coupled to the pull-down node;

a gate electrode of the sixth output control transistor is coupled to the pull-down node, a first electrode thereof is coupled to the second power source signal terminal, and a second electrode thereof is coupled to the pull-up node; and a gate electrode of the seventh output control transistor is coupled to the pull-down node, a first electrode thereof is coupled to the second power source signal terminal, and a second electrode thereof is coupled to the output terminal.

5. The shift register unit of claim 2, wherein the output circuit comprises an output transistor and a capacitor;

a gate electrode of the output transistor is coupled to the pull-up node, a first electrode thereof is coupled to the clock control circuit, and a second electrode thereof is coupled to the output terminal; and one terminal of the capacitor is coupled to the pull-up node, and the other terminal thereof is coupled to the output terminal.

6. The shift register unit of claim 2, wherein the first, second and third clock signals have the same duty ratio of ½, the phase difference between the first and second clock signals is 180 degrees, and the phase difference between the first and third clock signals is 90 degrees.

7. The shift register unit of claim 1, wherein the clock control circuit comprises a first control sub-circuit, a second control sub-circuit and an inversion sub-circuit;

the first control sub-circuit is coupled to the control signal terminal, a first power source signal terminal, the third clock signal terminal and the second control sub-circuit respectively, and is configured to, under the control of the control signal, input a first power source signal from the first power source signal terminal or the third clock signal from the third clock signal terminal to the second control sub-circuit;

the second control sub-circuit is coupled to the first control sub-circuit, the first clock signal terminal, the second clock signal terminal, the inversion sub-circuit and the output circuit respectively, and the second control sub-circuit is configured to, under the control of the first power source signal, input the first clock signal to the inversion sub-circuit and the output circuit respectively, or under the control of the third clock signal, alternately input the first and second clock signals to the inversion sub-circuit and alternately input the first and second clock signals to the output circuit; and the inversion sub-circuit is coupled to the second control sub-circuit and the output control circuit respectively, and is configured to invert the signal input by the second control sub-circuit and input the inverted signal to the output control circuit.

8. The shift register unit of claim 7, wherein the first control sub-circuit comprises a first transistor and a second transistor, the first and second transistors having opposite polarities;

a gate electrode of the first transistor is coupled to the control signal terminal, a first electrode thereof is coupled to the first power source signal terminal, and a second electrode thereof is coupled to the second control sub-circuit; and a gate electrode of the second transistor is coupled to the control signal terminal, a first electrode thereof is coupled to the third clock signal terminal, and a second electrode thereof is coupled to the second control sub-circuit.

9. The shift register unit of claim 7, wherein the inversion sub-circuit includes a first inverter whose input terminal is coupled to the second control sub-circuit and whose signal output terminal is coupled to the output control circuit.

10. The shift register unit of claim 7, wherein the second control sub-circuit comprises a third transistor and a fourth transistor, wherein the third transistor and the fourth transistor have opposite polarities;

a gate electrode of the third transistor is coupled to the first control sub-circuit, a first electrode thereof is coupled to the first clock signal terminal, and a second electrode thereof is coupled to the inversion sub-circuit and the output circuit respectively; and a gate electrode of the fourth transistor is coupled to the first control sub-circuit, a first electrode thereof is coupled to the second clock signal terminal, and a second electrode thereof is coupled to the inversion sub-circuit and the output circuit respectively.

11. The shift register unit of claim 7, wherein the second control sub-circuit comprises a second inverter, a first transmission gate, a third inverter and a second transmission gate;

an input terminal of the second inverter is coupled to the first control sub-circuit, and a signal output terminal thereof is coupled to a first control end of the first transmission gate;

a second control terminal of the first transmission gate is coupled to the first control sub-circuit, an input terminal thereof is coupled to the first clock signal terminal, and a signal output terminal thereof is coupled to the inversion sub-circuit and the output circuit respectively;

an input terminal of the third inverter is coupled to the first control sub-circuit, and a signal output terminal thereof is coupled to a second control terminal of the second transmission gate; and a first control terminal of the second transmission gate is coupled to the first control sub-circuit, an input terminal thereof is coupled to the second clock signal terminal, and a signal output terminal thereof is coupled to the inversion sub-circuit and the output circuit respectively.

12. The shift register unit of claim 1, wherein the output control circuit comprises a first output control transistor, a second output control transistor, a third output control transistor, a fourth output control transistor, a fifth output control transistor, a sixth output control transistor and a seventh output control transistor;

a gate electrode of the first output control transistor is coupled to an input signal terminal, a first electrode thereof is coupled to a third power source signal terminal, and a second electrode thereof is coupled to the pull-up node;

a gate electrode of the second output control transistor is coupled to a reset signal a first electrode thereof is coupled to a fourth power source signal terminal, and a second electrode thereof is coupled to the pull-up node;

a gate electrode of the third output control transistor is coupled to the pull-up node, a first electrode thereof is coupled to a second power source signal terminal, and a second electrode thereof is coupled to a pull-down node;

a gate electrode of the fourth output control transistor is coupled to the output terminal, a first electrode thereof is coupled to the second power source signal terminal, and a second electrode thereof is coupled to the pull-down node;
a gate electrode and the first electrode of the fifth output control transistor are coupled to the clock control circuit, and a second electrode thereof is coupled to the pull-down node;
a gate electrode of the sixth output control transistor is coupled to the pull-down node, a first electrode thereof is coupled to the second power source signal terminal, and a second electrode thereof is coupled to the pull-up node; and
a gate electrode of the seventh output control transistor is coupled to the pull-down node, a first electrode thereof is coupled to the second power source signal terminal, and a second electrode thereof is coupled to the output terminal.

13. The shift register unit of claim 1, wherein the output circuit comprises an output transistor and a capacitor;
a gate electrode of the output transistor is coupled to the pull-up node, a first electrode thereof is coupled to the clock control circuit, and a second electrode thereof is coupled to the output terminal; and
one terminal of the capacitor is coupled to the pull-up node, and the other terminal thereof is coupled to the output terminal.

14. The shift register unit of claim 1, wherein the first, second and third clock signals have the same duty ratio of ½, the phase difference between the first and second clock signals is 180 degrees, and the phase difference between the first and third clock signals is 90 degrees.

15. A method for driving a shift register unit, the shift register unit comprising a clock control circuit, an output control circuit and an output circuit, and the method comprising:
in a first driving mode in which a control signal output by a control signal terminal has a first electric potential, the clock control circuit inputs a first clock signal from a first clock signal terminal to the output circuit and inputs an inverted signal of the first clock signal to the output control circuit; and
in a second driving mode in which the control signal output by the control signal terminal has a second electric potential, a third clock signal terminal outputs a third clock signal, the clock control circuit alternately inputs the first clock signal and a second clock signal from a second clock signal terminal to the output circuit and alternately inputs the inverted signal of the first clock signal and an inverted signal of the second clock signal to the output control circuit,
wherein the first, second and third clock signals have the same frequency but different phases.

16. A gate driver on array, comprising:
at least two cascaded shift register units, each of which includes:
a clock control circuit, an output control circuit and an output circuit; wherein
the clock control circuit is coupled to a control signal terminal, a first clock signal terminal, a second clock signal terminal, a third clock signal terminal, the output control circuit and the output circuit respectively, and the clock control circuit is configured to, under the control of a control signal from the control signal terminal and a third clock signal from the third clock signal terminal, input a first clock signal from the first clock signal terminal and a second clock signal from the second clock signal terminal to the output circuit alternately, and input an inverted signal of the first clock signal and an inverted signal of the second clock signal to the output control circuit alternately, wherein the first, second and third clock signals have the same frequency but different phases;
the output control circuit is coupled to the clock control circuit, a pull-up node and an output terminal respectively, and is configured to control electric potentials of the pull-up node and the output terminal; and
the output circuit is coupled to the clock control circuit, a pull-up node and the output terminal respectively, and is configured to input a signal from the clock control circuit to the output terminal under the control of the pull-up node.

17. A display apparatus, comprising the gate driver on array according to claim 16.

18. The method of claim 17, wherein the first, second and third clock signals have the same duty ratio of ½, the phase difference between the first and second clock signals is 180 degrees, and the phase difference between the first and third clock signals is 90 degrees.

19. The method of claim 17, wherein any of the first and second driving modes comprises:
an input stage in which an input signal output by an input signal terminal has a second electric potential, and the output control circuit pulls an electric potential of a pull-up node up to the second electric potential;
an output stage in which the pull-up node maintains the second electric potential, and the output circuit receives and outputs a signal from the clock control circuit; and
a reset stage in which a reset signal output from a reset signal terminal has the second electric potential, and the output control circuit controls the electric potential of the pull-up node up to be the first electric potential.

20. The method of claim 17, wherein the clock control circuit comprises a first control sub-circuit, a second control sub-circuit and an inversion sub-circuit;
in a first driving mode in which the control signal has a first electric potential, the first control sub-circuit inputs a first power source signal from a first power source signal terminal to the second control sub-circuit; the first power source signal has a second electric potential, under the control of the first power source signal, the second control sub-circuit inputs the first clock signal to the output circuit and the inversion sub-circuit respectively; and the inversion sub-circuit inverts the first clock signal and inputs the inverted signal to the output control circuit; and
in a second driving mode in which the control signal has a second electric potential, the first control sub-circuit inputs the third clock signal to the second control sub-circuit; the second control sub-circuit inputs the first clock signal to the output circuit and the inversion sub-circuit respectively when the third clock signal has the second electric potential; the second sub-circuit inputs the second clock signal to the output circuit and the inversion sub-circuit respectively when the third clock signal has the first electric potential; and the inversion sub-circuit inverts an signal input by the second control sub-circuit and inputs the inverted signal to the control circuit.

* * * * *